United States Patent
Bhushan et al.

(10) Patent No.: US 12,255,163 B2
(45) Date of Patent: Mar. 18, 2025

(54) BOND PADS FOR SEMICONDUCTOR DIE ASSEMBLIES AND ASSOCIATED METHODS AND SYSTEMS

(71) Applicant: Micron Technology, Inc., Boise, ID (US)

(72) Inventors: Bharat Bhushan, Taichung (TW); Akshay N. Singh, Boise, ID (US); Keizo Kawakita, Hiroshima (JP); Bret K. Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 320 days.

(21) Appl. No.: 17/666,437

(22) Filed: Feb. 7, 2022

(65) Prior Publication Data
US 2023/0048311 A1    Feb. 16, 2023

Related U.S. Application Data

(60) Provisional application No. 63/232,581, filed on Aug. 12, 2021.

(51) Int. Cl.
*H01L 23/00*    (2006.01)
*H01L 25/065*    (2023.01)

(52) U.S. Cl.
CPC .............. *H01L 24/08* (2013.01); *H01L 24/03* (2013.01); *H01L 24/05* (2013.01); *H01L 24/29* (2013.01);
(Continued)

(58) Field of Classification Search
CPC ......... H01L 25/0657; H01L 2924/1431; H01L 24/08; H01L 24/29
See application file for complete search history.

(56) References Cited

U.S. PATENT DOCUMENTS 11,158,606 B2    10/2021    Gao et al.
2002/0047214 A1*    4/2002    Morinaga ........... H01L 23/3121
                                                              257/E23.125
(Continued)

FOREIGN PATENT DOCUMENTS

CN    1750244 A    3/2006
TW    202006890 A    2/2020

OTHER PUBLICATIONS

EP Patent Application No. 22189871.1—Extended European Search Report, issued Jun. 26, 2023, 8 pages.
(Continued)

*Primary Examiner* — Dale E Page
*Assistant Examiner* — Wilner Jean Baptiste
(74) *Attorney, Agent, or Firm* — Perkins Coie LLP (57) ABSTRACT

Bond pads for semiconductor die assemblies, and associated methods and systems are disclosed. In one embodiment, a semiconductor die assembly includes a first semiconductor die including a first bond pad on a first side of the first semiconductor die. The semiconductor die assembly further includes a second semiconductor die including a second bond pad on a second side of the second semiconductor die. The first bond pad is aligned and bonded to the second bond pad at a bonding interface between the first and second bond pads, and at least one of the first and second bond pads include a first metal and a second metal different than the first metal. Further, the first metal is located at the bonding interface and the second metal has a first thickness corresponding to at least one-fourth of a second thickness of the first or second bond pad.

13 Claims, 9 Drawing Sheets

(52) U.S. Cl.
CPC ............ *H01L 24/32* (2013.01); *H01L 24/80* (2013.01); *H01L 25/0657* (2013.01); *H01L 2224/03848* (2013.01); *H01L 2224/05124* (2013.01); *H01L 2224/05541* (2013.01); *H01L 2224/05583* (2013.01); *H01L 2224/05647* (2013.01); *H01L 2224/05687* (2013.01); *H01L 2224/08146* (2013.01); *H01L 2224/29187* (2013.01); *H01L 2224/32145* (2013.01); *H01L 2224/80895* (2013.01); *H01L 2225/06524* (2013.01); *H01L 2225/06548* (2013.01); *H01L 2924/1431* (2013.01); *H01L 2924/1436* (2013.01)

(56) References Cited

U.S. PATENT DOCUMENTS

| | | | |
|---|---|---|---|
| 2006/0055021 | A1 | 3/2006 | Yamamoto |
| 2014/0175655 | A1 | 6/2014 | Chen et al. |
| 2014/0353828 | A1 | 12/2014 | Edelstein et al. |
| 2016/0155724 | A1 | 6/2016 | Kim et al. |
| 2018/0240859 | A1 | 8/2018 | Yang |
| 2020/0075534 | A1* | 3/2020 | Gao ................... H01L 24/16 |
| 2020/0194396 | A1 | 6/2020 | Uzoh |

OTHER PUBLICATIONS

TW Patent Application No. 111125314—Taiwanese Office Action and Search Report, issued Mar. 23, 2023, with English Translation, 14 pages.
KR Patent Application No. 10-2022-0090021—Korean Office Action and Search Report, issued Jul. 30, 2024, with English Translation, 16 pages.

\* cited by examiner

BOND PADS FOR SEMICONDUCTOR DIE ASSEMBLIES AND ASSOCIATED METHODS AND SYSTEMS

CROSS-REFERENCE TO RELATED APPLICATION(S)

The present application claims priority to U.S. Provisional Patent Application No. 63/232,581, filed Aug. 12, 2021, the disclosure of which is incorporated herein by reference in its entirety.

TECHNICAL FIELD

The present disclosure generally relates to semiconductor die assemblies, and more particularly relates to bond pads for semiconductor die assemblies and associated methods and systems.

BACKGROUND

Semiconductor packages typically include a semiconductor die (e.g., memory chip, microprocessor chip, imager chip) mounted on a substrate and encased in a protective covering (e.g., an encapsulating material). The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the size of semiconductor packages to fit within the space constraints of electronic devices. In some semiconductor packages, direct chip attach methods (e.g., flip-chip bonding between the semiconductor die and the substrate) may be used to reduce the footprint of the semiconductor packages. Such direct chip attach methods include directly connecting multiple conductive pillars electrically coupled to the semiconductor die to corresponding conductive structures (e.g., conductive bumps) of the substrate. In this regard, a solder structure may be formed over individual conductive pillars for bonding the conductive pillars to the corresponding conductive structures—e.g., forming joint structures that include the conductive pillar, the solder structure, and the conductive bump. Further, an encapsulating material can be applied to protect the semiconductor die.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments directed to bond pads for semiconductor die assemblies, and associated systems and methods are described below. Wafer level packaging (WLP) can provide scaled form factors for semiconductor die assemblies (semiconductor device assemblies). The WLP techniques utilizes an interface wafer, to which semiconductor dies or stacks of semiconductor dies (e.g., active dies, known good dies, memory dies) are attached. Individual semiconductor dies (or stacks of semiconductor dies) are aligned with and electrically connected to corresponding interface dies of the interface wafer. The interface dies may include different types of semiconductor dies than the semiconductor dies (e.g., logic dies that control the semiconductor dies) or interposer dies with redistribution layers (RDLs) configured to route electrical signals between the semiconductor dies (or the semiconductor dies of the stacks) and higher level circuitry (e.g., a host device external to the logic dies and/or the memory dies).

After semiconductor dies (or the stacks of semiconductor dies) have been attached to the interface wafer, which may be referred to as chips on wafer (CoW), an encapsulating material (e.g., mold compound materials, epoxy molding compounds (EMC)) can be disposed over the interface wafer such that the semiconductor dies (or the stacks of semiconductor dies) are immersed in the encapsulating material. Subsequently, the encapsulating material is cured at an elevated temperature to harden the encapsulating material so as to provide protection for the semiconductor dies. Excess encapsulating material above the semiconductor dies (or the stacks of semiconductor dies) may be removed using a grinding process step. The process steps to provide protection for the semiconductor dies using the encapsulating material may be referred to as a molding process. After the molding process, one or more singulation process steps may follow to singulate (e.g., sever, separate) individual semiconductor die assemblies along scribe lines of the interface wafer.

For certain semiconductor die assemblies, the semiconductor dies are attached to the interface wafer (or the interface dies of the interface wafer) by forming joint structures therebetween—e.g., forming conductive pillars on the semiconductor dies, forming conductive bumps on the interface dies, and connecting the conductive pillars to the conductive bumps using solder. A distance between the semiconductor dies and the interface dies may be referred to as a bond line thickness (BLT), which is related to a total height of the joint structures. Similarly, two or more semiconductor dies (e.g., memory dies) can be attached to each other by forming the joint structures between them to generate a stack of semiconductor dies. In some cases, the semiconductor die assemblies includes an interface die carrying a stack of semiconductor dies (e.g., 4, 8, 12, or even greater quantities of semiconductor dies). Accordingly, the BLTs add up to limit the quantity of semiconductor dies that can be accommodated in the semiconductor die assemblies while satisfying a height specification for the semiconductor die assemblies.

The joint structures between the semiconductor dies (or between the semiconductor die and the interface die) can be eliminated by utilizing direct bonding schemes, which may also be referred to as zero-BLT configurations. Accordingly, the direct bonding schemes can facilitate reducing overall heights of semiconductor die assemblies or increasing a quantity of semiconductor dies while satisfying height requirements of semiconductor die assemblies. Typically, the direct bonding schemes include two or more dissimilar materials (e.g., electrically conductive materials and dielectric materials surrounding the conductive materials) that are directly bonded to corresponding counterparts. In other words, conductive materials of a first semiconductor die bonded to corresponding conductive materials of a second semiconductor die and dielectric materials of the first semiconductor die bonded to corresponding dielectric materials of the second semiconductor die, respectively. In this manner, the direct bonding scheme can form interconnects (electrically conductive paths with zero-BLT) between conductive materials of the first and second semiconductor dies while surrounding dielectric materials provide electrical isolation and structural support for the interconnects.

Accordingly, the direct bonding may be referred to as combination bonding, hybrid bonding, or the like. In general, the direct bonding process includes two stages. First, two dies/wafers (e.g., a top die/wafer, a bottom die/wafer) are attached together such that dielectric materials of the top and bottom dies/wafers are bonded to each other. In some embodiments, the surfaces to be bonded are activated (e.g., using a plasma treatment process) to facilitate bonding of the surfaces. Also, bond pads (including electrically conductive materials) of the top and bottom dies are aligned to face each other to form conductive paths therebetween as described below in more detail. Further, the bond pads may be recessed with respect to surfaces of the dielectric materials (e.g., a bonding interface, a mating interface) such that bonding of the dielectric materials can be accomplished without any interference from protruded bond pads.

Subsequently, the bonded dies/wafers are annealed in an elevated temperature (e.g., post bond annealing) such that the conductive materials of the top and bottom dies may expand toward each other (e.g., due to the mismatch in coefficients of thermal expansion (CTE) between the conductive materials and the dielectric materials) within an open space defined by the recess and the dielectric material surrounding the bond pads. When the surfaces of the top and bottom conductive materials are in contact, the conductive materials are conjoined (e.g., via atomic migration (intermixing, diffusion) from one conductive material to another conductive material) to form permanent bonding—e.g., metallurgical bonding. Once the bonding is formed between the conductive pads, the conductive materials do not separate (or sever) when the bonded dies/wafers are brought to the ambient temperature or operating temperatures of the semiconductor die assemblies.

The direct bonding schemes provide various advantages for the semiconductor device assemblies. For example, yield, reliability, and/or performance issues associated with forming the joint structures are eliminated in the direct bonding schemes. Further, various process steps for fabricating semiconductor devices (e.g., process steps for forming copper interconnects, chemical-mechanical polishing processing steps, wet/dry etch process steps) can be used to generate the bond pads such that pitches of the bond pads can be scaled for fine pitch semiconductor die stacking. Also, storage capacity of the semiconductor device assemblies can be increased while maintaining the same package height by accommodating an increased quantity of memory dies in the semiconductor device assemblies—e.g., due to the zero-BLT.

One of the challenges associated with the direct bonding schemes may be the thermal cycles associated with annealing of the bonded dies/wafers (e.g., dies/wafers attached to each other using the dielectric layer bonding) to form metallurgical bonding between the bond pads during the post bond annealing. In some cases, the post bond annealing temperatures range between approximately 350° C. to 450° C. In some embodiments, lowering the post bond annealing temperatures may be beneficial in view of certain materials used during the direct bonding process steps—e.g., an adhesive material used to attach the wafers (e.g., semiconductor wafers including memory dies, interface wafers including logic dies) to carrier substrates. Additionally, or alternatively, the post bond annealing temperatures can be limited to avoid additional thermal cycles to the semiconductor dies (e.g., dynamic random access memory (DRAM) products) that have completed their processing. In some cases, the additional thermal cycle may have undesired effects to the semiconductor dies.

The present technology is devised to facilitate bonding between bond pads for direct bonding schemes. More specifically, the present technology may be suited for post bond annealing process at relatively lower temperatures, for example, approximately 200° C. or lower. For example, the bond pads may include composite conductive materials (two or more conductive materials (e.g., a composite metal structure) in addition to a conductive material used as a liner of the bond pads) that are different from each other. In this regard, a conductive material exhibiting relatively higher diffusivity at the annealing temperature (e.g., the post bond annealing temperature) may be disposed at the bonding interface (mating interface) of the bond pads. As a result, bonding strength between the bond pads can be enhanced at least due to the higher diffusivity—e.g., facilitating grain growth across the bonding interface, improving intermixing of the conductive materials across the bonding interface, avoiding micro-void formation at the bonding interface, etc. In some embodiments, such conductive materials include copper. In some embodiments, the copper has primarily (111) crystallographic orientation, which may also be referred to as nanotwin copper (e.g., NT-Cu (111)).

Further, remaining portions of the bond pads that are away from the bonding interface may include conductive material different from the nanotwin copper—e.g., copper without a particular primary crystallographic orientation or copper with a primary crystallographic orientation different than (111), such as (100) or (110) crystallographic orientations. The NT-Cu (111) has higher diffusivity (e.g., about three (3) times greater diffusivity when compared to copper having other crystallographic configurations) that facilitates bonding between bond pads at relatively lower post bond annealing temperatures (e.g., approximately 200° C. or lower), for example, by suppressing copper-to-copper dishing voids formation. As such, the bond pads including NT-Cu (111) at the mating interface may be suited for the direct bonding process with the relatively lower post bond annealing temperatures—e.g., chip-to-wafer (C2W) direct bonding schemes, face-to-back (F2B) direct bonding schemes.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 2A through 5.

As used herein, the terms "vertical," "lateral," "down," "up," "upper," and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling.

Figure 1:
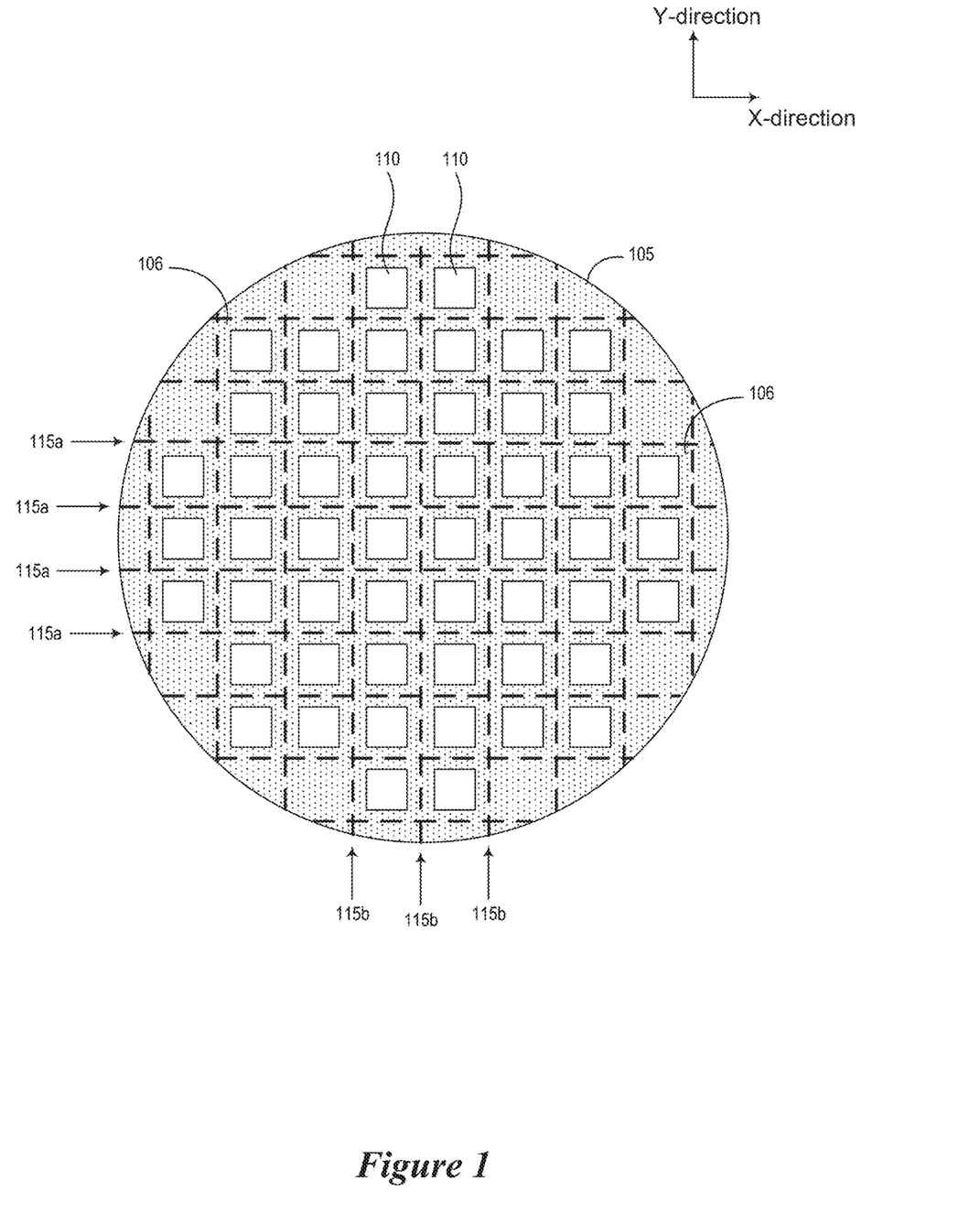
FIG. 1 is a diagram of an interface wafer with stacks of semiconductor dies in accordance with embodiments of the present technology.

FIG. 1 is a diagram of an interface substrate 105 (or an interface wafer) with stacks of semiconductor dies 110 in accordance with embodiments of the present technology. The interface substrate 105 carrying the stacks of semiconductor dies 110 may be referred to as a reconstituted wafer (or CoW as described above) in view of the singulated, individual semiconductor dies 110 (or stacks of semiconductor dies 110) that are aligned and attached to corresponding interface dies 106 of the interface substrate 105.

Although the present technology is described herein with semiconductor device assemblies including a stack of semiconductor dies (e.g., the stacks of semiconductor dies 110) attached to an interface die (e.g., the interface die 106), it should be understood that the principles of the present technology is not limited thereto. For example, a semiconductor device assembly in accordance with the present technology may include a single semiconductor die (e.g., a memory die) attached (or bonded) to an interface die.

In some embodiments, the interface dies 106 are different types of semiconductor dies (e.g., logic dies, controller dies) than the semiconductor dies 110 (e.g., memory dies, DRAM products) of the stacks. The logic dies can be configured to exchange electrical signals with the semiconductor dies 110 and with higher level circuitry (e.g., a host device external to the semiconductor device assembly) coupled with the logic dies. In some embodiments, the interface dies 106 are interposer dies having various conductive structures (e.g., redistribution layers, vias, interconnects) configured to route electrical signals between the stacks of semiconductor dies 110 and higher level circuitry—e.g., a central processing unit (CPU) coupled with the stacks of semiconductor dies 110 through the interposer die.

The stacks of semiconductor dies 110 include semiconductor dies 110 stacked on top of each other. Each semiconductor die 110 of the stack has a frontside facing toward the interface die 106, which may be referred to as an active side of the semiconductor die having memory arrays, integrated circuits coupled to the memory arrays, bond pads coupled to the integrated circuits, etc., and a backside opposite to the frontside. As described in more detail herein, the backside of semiconductor dies 110 may include bond pads configured to attach to (or bond to) bond pads of another die (or wafer). Further, the semiconductor dies 110 may include through-substrate vias (TSVs) extending through the semiconductor dies 110 configured to couple the bond pads on the frontside with the bond pads on the backside. The uppermost semiconductor die 110 of the stack may be referred to as a top die, and one or more semiconductor dies 110 located between the top die and the interface die 106 may be referred to as core dies.

Similarly, the logic dies 106 include a frontside (e.g., the active side of the logic die having various integrated circuits, bond pads and/or conductive structures coupled to the integrated circuits, etc.) and a backside opposite to the frontside. The conductive structures on the frontside may include redistribution layers and vias, as well as conductive pillars/pads and/or terminals (e.g., balls in a ball-grid-array (BGA)) configured to couple with higher level circuitry—e.g., a central processing unit (CPU). The backside of the logic die 106 may include bond pads configured to attach to (or bond to) bond pads of another die (e.g., the semiconductor die 110). Further, the logic dies 106 may include TSVs extending through the logic dies 106 configured to couple the bond pads on the frontside with the bond pads on the backside.

In some embodiments, after completing frontside wafer processing (e.g., forming the bond pads coupled to the integrated circuits), core wafers (wafers including the core dies) are temporarily attached to carrier wafers (or substrates) using an adhesive material—e.g., the frontside of the core wafer facing the carrier wafer. Subsequently, the core wafers can be thinned to expose TSVs of the core dies from the backside. Various structures are formed at the backside of the core dies/wafers that have been thinned to facilitate stacking of the core dies—e.g., depositing dielectric layers to protect the backside of the core dies, forming bond pads connected to the exposed surface of TSVs, etc. In some embodiments, the adhesive material may restrict temperatures at which the dielectric layers deposited (and/or the bond pads are annealed). Then, the core dies are diced and stacked on the interface substrate 105 along with the top die (e.g., using process steps for direct bonding) to generate the reconstituted wafer as illustrated in FIG. 1. The top dies of the stack, however, may be thicker than the core dies and may not have backside conductive structures (or TSVs).

The process steps used for preparing semiconductor dies for stacking them on top of each other (e.g., forming bond pads and/or conductive structures coupled to integrated circuits on the frontside of the wafer, temporarily attaching the wafer to a carrier substrate, thinning the wafer from the backside, forming the conductive pads on the backside, etc.) can be applied to the interface substrate 105 such that appropriate conductive structures for stacking semiconductor dies can be formed on the frontside and backside of the interface dies 106. As such, the interface substrate 105 may correspond to the interface wafer having completed the process steps described above—e.g., having been thinned and including appropriate conductive structures for stacking on the frontside and backside. FIG. 1 also depicts scribe lines 115 (which may be referred to as dicing lanes, cutting lines, or the like) of the interface substrate 105 (e.g., horizontal scribe lines 115a along the x-direction and vertical scribe lines 115b along the y-direction) between the stacks of semiconductor dies 110. In some embodiments, after completing the molding process for the CoW, individual semiconductor die assemblies are singulated along the scribelines.

Figure 2A:
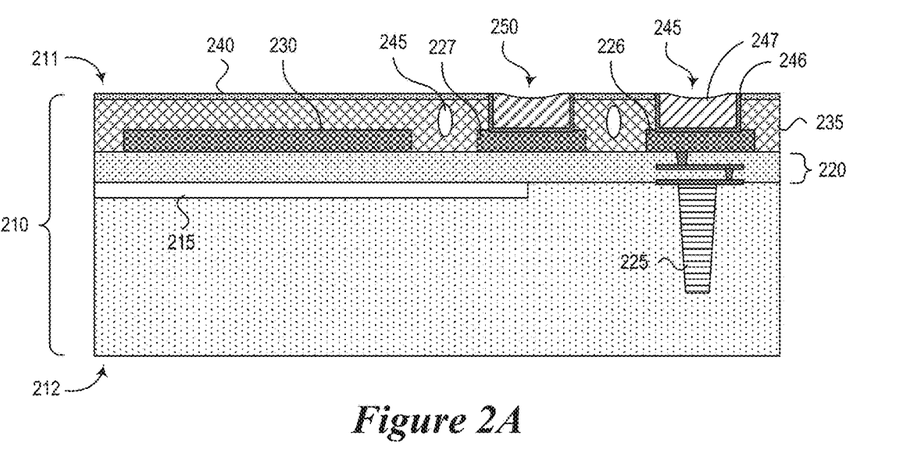
FIGS. 2A through 2C illustrate stages of a process for core semiconductor dies in accordance with embodiments of the present technology.
Figure 2B:
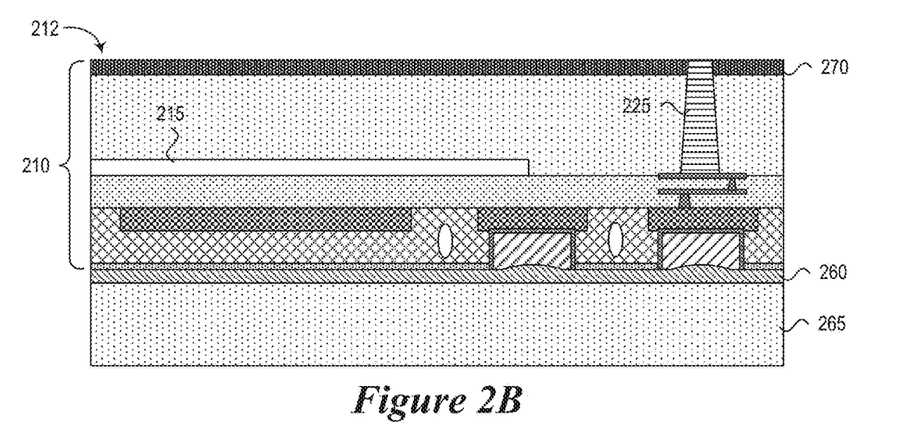
Figure 2C:
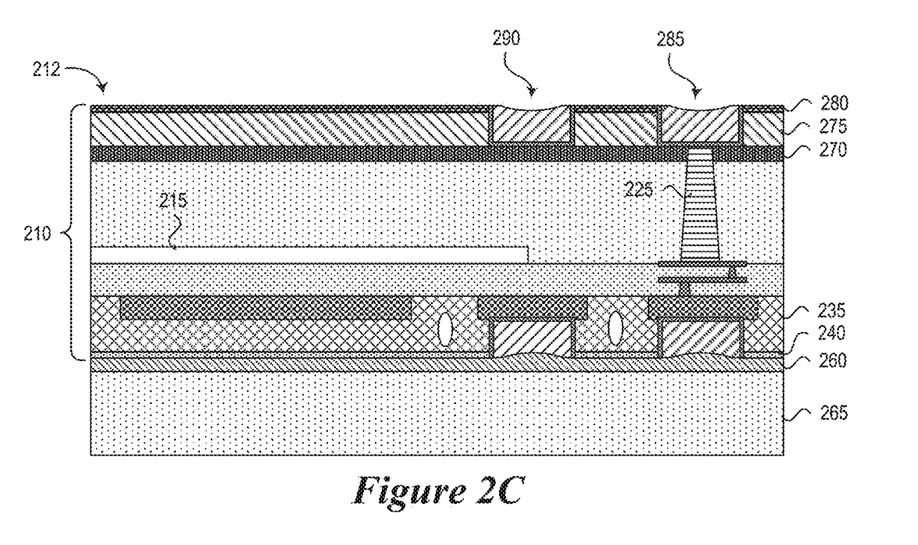

FIGS. 2A through 2C illustrate stages of a process for core semiconductor dies (or core wafers including the core semiconductor dies) in accordance with embodiments of the present technology. FIG. 2A illustrates a cross-sectional view of a portion of a core semiconductor die (e.g., a core DRAM die of a core wafer) after various structures formed upon completing the frontside processing. For example, FIG. 2A illustrates a semiconductor die 210 (which may be an example of or include aspects of the semiconductor die 110) having a frontside 211 and a backside 212 opposite to the frontside 211. The frontside 211 of the semiconductor die 210 includes integrated circuits 215 (e.g., a memory array, peripheral circuitry operatively coupled to the memory array, etc.), an interconnect layer 220 (e.g., one or more dielectric layers including conductive traces and vias) coupled to the integrated circuits 215 and a through-substrate via 225 (TSV). The interconnect layer 220 is further coupled to a TSV pad 226 and a probe pad 230. The semiconductor die 210 also includes a dummy pad 227 that may be isolated (e.g., electrically isolated from the integrated circuits 215) or connected to a ground plane of the semiconductor die 210. In some embodiments, the pads 226, 227, and 230 include Al (or AlCu alloy).

After the pads 226, 227, and 230 have been formed on the interconnect layer 220, a dielectric layer 235 (e.g., silicon oxide (SiOx) deposited at around 375° C.) may be formed. Depending on aspect ratios that the pads 226, 227, and 230 provide, one or more airgaps 245 may be present in the dielectric layer 235. Thereafter, a dielectric layer 240 (e.g., silicon carbon nitride (SiCN) deposited at around 350° C.) may be formed on the dielectric layer 235. Subsequently, bond pads 245 and 250 are formed in the dielectric layers 235 and 240. Individual bond pads 245 and 250 include a conductive liner 246 (e.g., TaN) and a metal 247 (e.g., copper). The metal 247 may include two or more metals (in addition to the conductive liner 246) having different material properties as described in more detail with reference to FIGS. 6A and 6B.

The bond pad 245 is coupled to the TSV 225 through the TSV pad 226 and the interconnect layer 220 whereas the bond pad 250 is not connected to any electrically active and/or functional components of the semiconductor die 210. As such, the bond pad 250 may be referred to as a dummy bond pad while the bond pad 245 may be referred to an active bond pad. The bond pad 250 (or a plurality of bond pads 250 distributed throughout the semiconductor die 210) may provide process uniformity required for the bond pad 245 to satisfy—e.g., the surface of bond pads 245 prohibited from protruding above the surface of the dielectric layer 240, recessing (dishing and/or erosion) of the metal (e.g., copper) below the surface of the dielectric layer 240 being within an acceptable range—e.g., after chemical mechanical polishing (CMP) process steps. Such requirements for the bond pads 245 and 250 facilitate proper bonding of the frontside 211 with other semiconductor dies (or the logic die).

FIG. 2B illustrates a cross-sectional view of the semiconductor die 210 after the TSV 225 has been exposed from the backside 212. In this regard, the semiconductor die 210 has been temporarily attached to a carrier substrate 265 using an adhesive material 260 with the frontside 211 of the semiconductor die 210 facing the carrier substrate 265. Subsequently, a back grinding process (or a CMP process) has been performed to expose the TSV 225 from the backside 212. In some embodiments, a portion of the TSV 225 may be protruded from the backside 212, and a dielectric layer 270 (e.g., silicon nitride (SiN) deposited at around 180° C.) may be formed to cover the backside of the semiconductor die 210. Thereafter, a portion of the dielectric layer 270 above the TSV 225 may be removed (e.g., polished) to expose the TSV 225 as depicted in FIG. 2B.

FIG. 2C illustrates a cross-sectional view of the semiconductor die 210 after various structures have been formed upon completing the backside processing. For example, FIG. 2C illustrates a dielectric layer 275 (e.g., SiOx deposited at around 180° C.), a dielectric layer 280 (e.g., SiN or SiCN deposited at around 180° C.), and the bond pads 285 and 290 formed in the dielectric layers 275 and 280. Similar to the bond pads 245 and 250, the bond pad 290 may be referred to as a dummy bond pad whereas the bond pad 285 may be referred to an active bond pad. The bond pad 285 is coupled to the bond pad 245 through the TSV 225 that extends through the semiconductor die 210. In some embodiments, the bond pads 285 and 290 have the same structural configuration with the bond pads 245 and 250. For example, individual bond pads 285 and 290 include a conductive liner 246 (e.g., TaN) and a metal (e.g., copper) that includes two or more metals (in addition to the conductive liner 246) having different material properties as described in more detail with reference to FIGS. 6A and 6B.

It should be noted that temperatures, at which various process steps are performed on the backside 212 may be restricted (limited) in view of the adhesive material 260. For example, the temperatures at which the dielectric layers 270, 275, and 280 are formed are less than the temperatures at which the dielectric layers 235 and 240 are formed. After the backside processing has been completed as shown in FIG. 2C, the semiconductor dies 210 may be singulated and detached from the carrier substrate 265 (e.g., by removing the adhesive material 260) such that the semiconductor dies 210 can be attached to the interface die 106 (and/or stacked on top of each other to form a stack of semiconductor dies 210) to form the CoW described with reference to FIG. 1.

Figure 3:
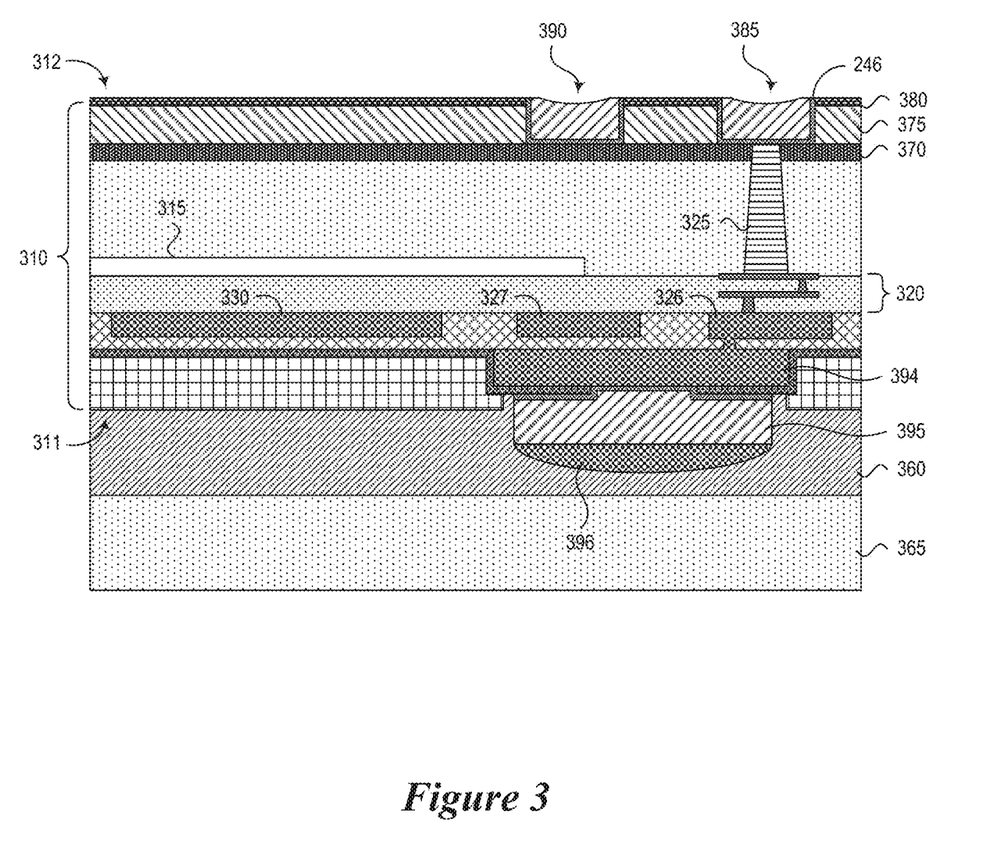
FIG. 3 is a diagram illustrating a portion of an interface wafer in accordance with embodiments of the present technology.

FIG. 3 illustrates a cross-sectional view of a portion of an interface die 310 (which may be an example of or include aspects of the interface die 106) of an interface wafer (e.g., the interface substrate 105) after various structures have been formed upon completing both the frontside and backside processing. As such, the interface die 310 may be regarded as in the same stage of the semiconductor die 210 illustrated in FIG. 2C. For example, the interface die 310 includes a frontside 311 and a backside 312 opposite to the frontside 311. The frontside 311 of the interface die 310 includes various integrated circuits 315 (e.g., logic circuitry), an interconnect layer 320 (e.g., one or more dielectric layers including conductive traces and vias) coupled to the integrated circuits 315 and a TSV 325. The interconnect layer 320 is further coupled to a TSV pad 326 and a probe pad 330. In some embodiments, the TSV pad 326, a dummy pad 327, and the probe pad 330 include Al (or AlCu alloy). The TSV pad 326 can be further coupled to a conductive pad 394, which is coupled to a copper pad 395. In some embodiments, a solder bump 396 is formed on the copper pad 395. In some embodiments, the conductive pad 394 includes aluminum while the solder bump 396 includes SnAg alloy.

The frontside 311 of the interface die 310 may be temporarily attached to a carrier substrate 365 using an adhesive material 360 such that the backside processing described with reference to FIGS. 2B and 2C can be performed on the backside 312 of the interface die 310. As such, the interface die 310 has been thinned from the backside (e.g., using the back grind process) to expose the TSV 325. Subsequently, dielectric layers 370 (e.g., SiN deposited at around 180° C.), 375 (e.g., silicon oxide deposited at around 180° C.), and 380 (e.g., SiCN or SiN deposited at around 180° C.) are formed on the backside. A bond pad 385 (an active bond pad) and a bond pad 390 (a dummy bond pad) are formed in the dielectric layers 380 and 375. In some embodiments, the bond pads 385 and 390 have the same structural configuration with the bond pads 245 and 250. For example, individual bond pads 385 and 390 include a conductive liner (e.g., the conductive liner 246) and a metal (e.g., copper) that includes two or more metals (in addition to the conductive liner 246) having different material properties as described in more detail with reference to FIGS. 6A and 6B.

Figure 4A:
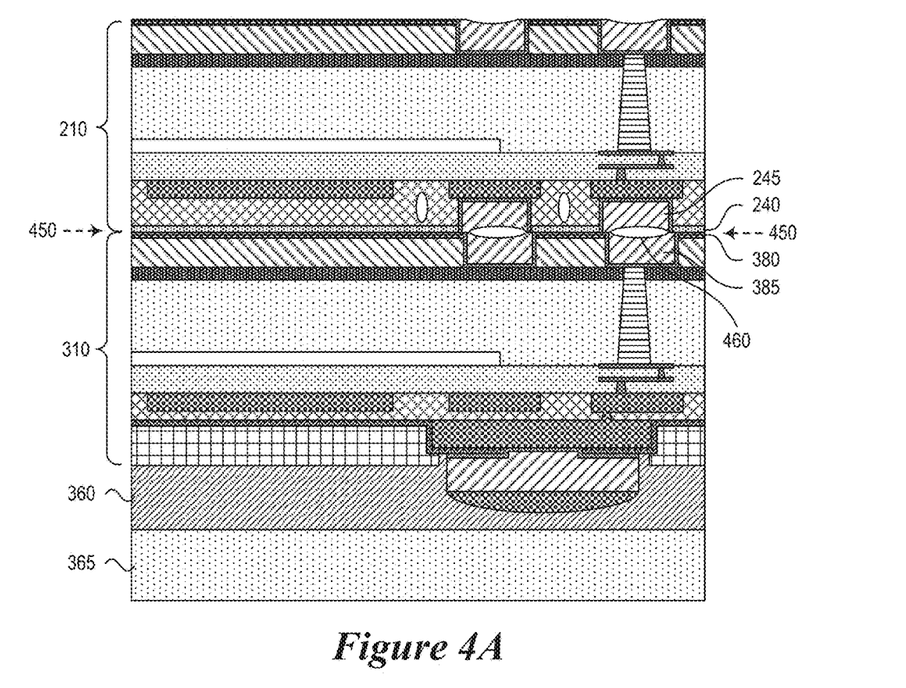
FIGS. 4A and 4B illustrate stages of a process for forming semiconductor die assemblies in accordance with embodiments of the present technology.
Figure 4B:
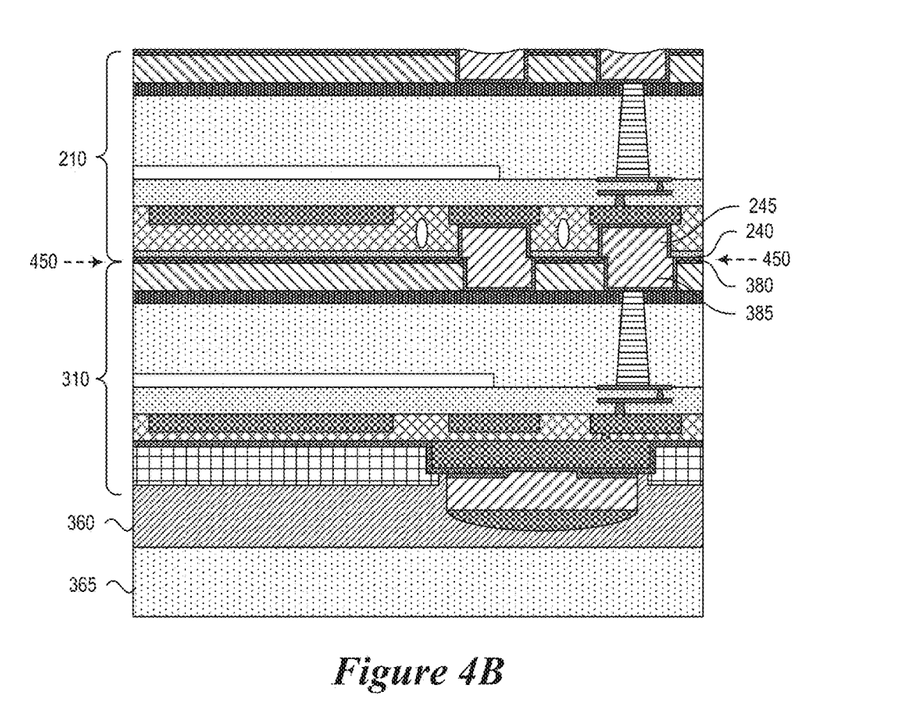

FIGS. 4A and 4B illustrate stages of a process for forming semiconductor die assemblies in accordance with embodiments of the present technology. FIG. 4A illustrates that a semiconductor die (e.g., the semiconductor die 210 depicted in FIG. 2C) is attached to an interface die (e.g., the interface die 310 depicted in FIG. 3) of an interface wafer that is attached to the carrier substrate 365 through the adhesive material 360. In this regard, the frontside 211 of the semiconductor die 210 and the backside of the interface die 310 may have been treated with a plasma process to facilitate bonding between the dielectric layer 240 (e.g., SiCN deposited at around 350° C.) of the semiconductor die 210 and the dielectric layer 380 (e.g., SiCN or SiN deposited at around 180° C.) of the interface die 310 at a bonding interface 450. It should be noted that the surface of the bond pads (e.g., metal surfaces of the bond pad 245 and the bond pad 385) may not be completely joined together (e.g., conjoined) at this stage due to the recess in the surfaces of the metals. For example, FIG. 4A illustrates a gap 460 formed by the recess.

FIG. 4B illustrates that the semiconductor die 210 attached to the interface die 310 after a thermal annealing step (e.g., at approximately 200° C. or lower temperatures for approximately 2 hours or so). During the thermal annealing step, the metal (e.g., copper) of the bond pad 245 and the bond pad 385 expands toward each other (e.g., due to the mismatch in CTE between the metal and the dielectric materials) within an open space defined by the recess and the dielectric layers 240 and 380 surrounding the bond pads 245 and 385. When the surfaces of the top and bottom metals are in contact, the metals are conjoined (e.g., via atomic migration (or intermixing) from one metal to another metal) to form permanent bonding—e.g., metallurgical bonding. Accordingly, the metals (e.g., copper) of the bond pads 245 and 385 form a contiguous metal structure (e.g., without the gap across the bonding interface 450—e.g., after the thermal annealing step). For example, FIG. 4B illustrates that the gap 460 is removed during the thermal annealing step.

Figure 5:
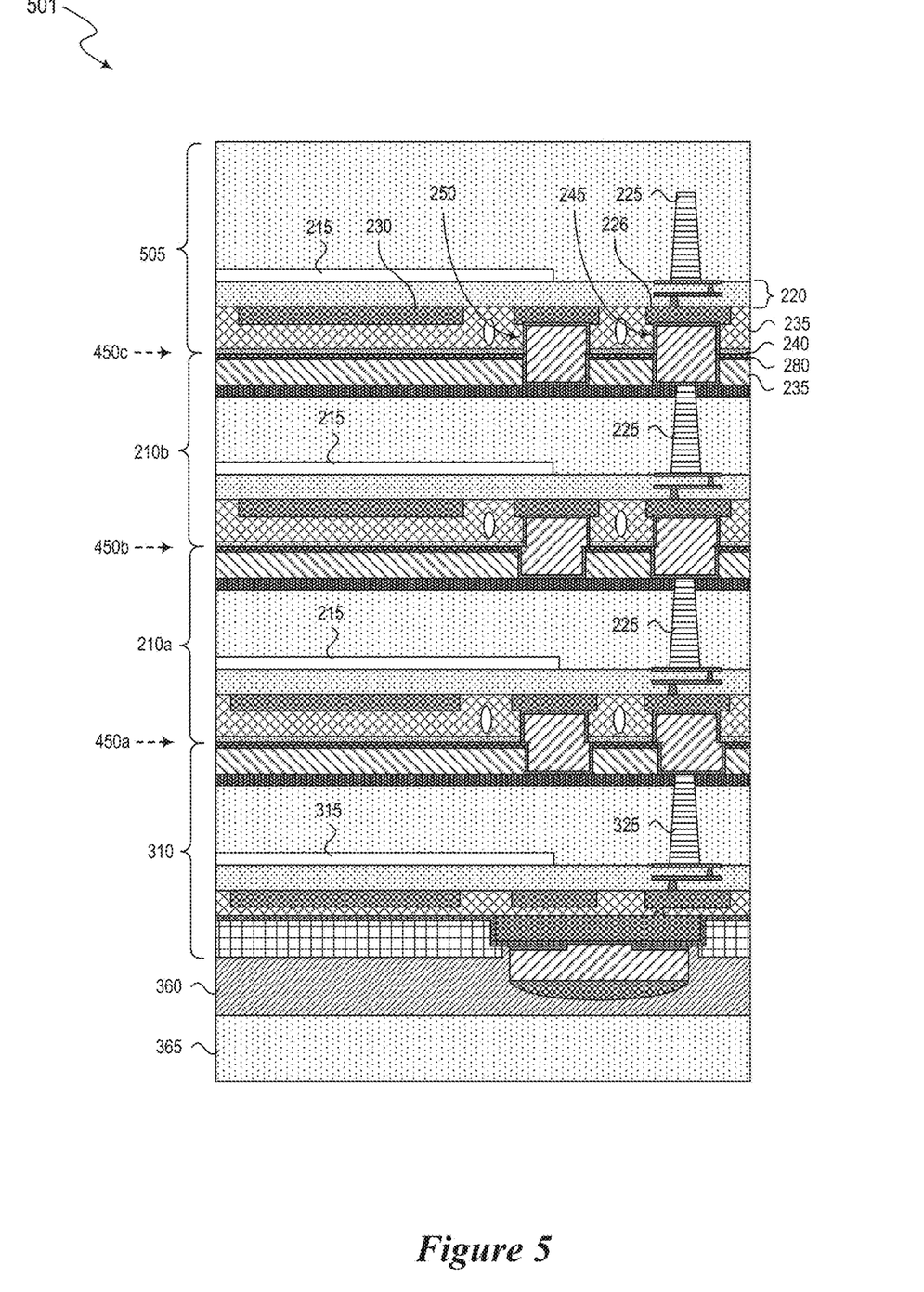
FIG. 5 is a diagram of a semiconductor die assembly in accordance with embodiments of the present technology.

FIG. 5 is a diagram of a semiconductor die assembly 501 in accordance with embodiments of the present technology. The semiconductor die assembly 501 includes an interface die (e.g., the interface die 310) directly bonded to a stack of semiconductor dies at a bonding interface 450a. The stack of semiconductor dies includes core semiconductor dies 210a and 210b (e.g., the semiconductor die 210) and a top semiconductor die 505, each of them directly bonded to each other at bonding interfaces 450b and 450c.

The top semiconductor die 505 includes aspects of the semiconductor die 210. For example, the top semiconductor die 505 includes the integrated circuits 215 and the interconnect layer 220 coupled to the integrated circuits 215 and the TSV 225. The interconnect layer 220 is further coupled to the TSV pad 226 and the probe pad 230. Moreover, the top semiconductor die 505 includes bond pads 245 and 250 formed in the dielectric layers 235 and 240. In some embodiments, the TSV 225 is omitted for the top semiconductor die 505. In some embodiments, the top semiconductor die 505 is thicker than the core semiconductor dies 210a and 210b as the top semiconductor die 505 may not need to be thinned from the backside.

As depicted in FIG. 5, the semiconductor die assembly 501 is temporarily attached to the carrier substrate 365 using the adhesive material 360. In some embodiments, the molding process steps may be carried out to provide protection for the semiconductor die assembly 501. Subsequently, individual semiconductor die assembly 501 may be singulated and detached from the carrier substrate 365. Although the semiconductor die assembly 501 illustrates the stack of semiconductor dies with three (3) semiconductor dies (i.e., the core semiconductor dies 210a and 210b and the top semiconductor die 505) bonded to the interface die 310, the present technology is not limited thereto. For example, the stack of semiconductor dies may include 8, 12, 16, 32, or even greater quantities of the semiconductor dies (e.g., memory dies).

Figure 6A:
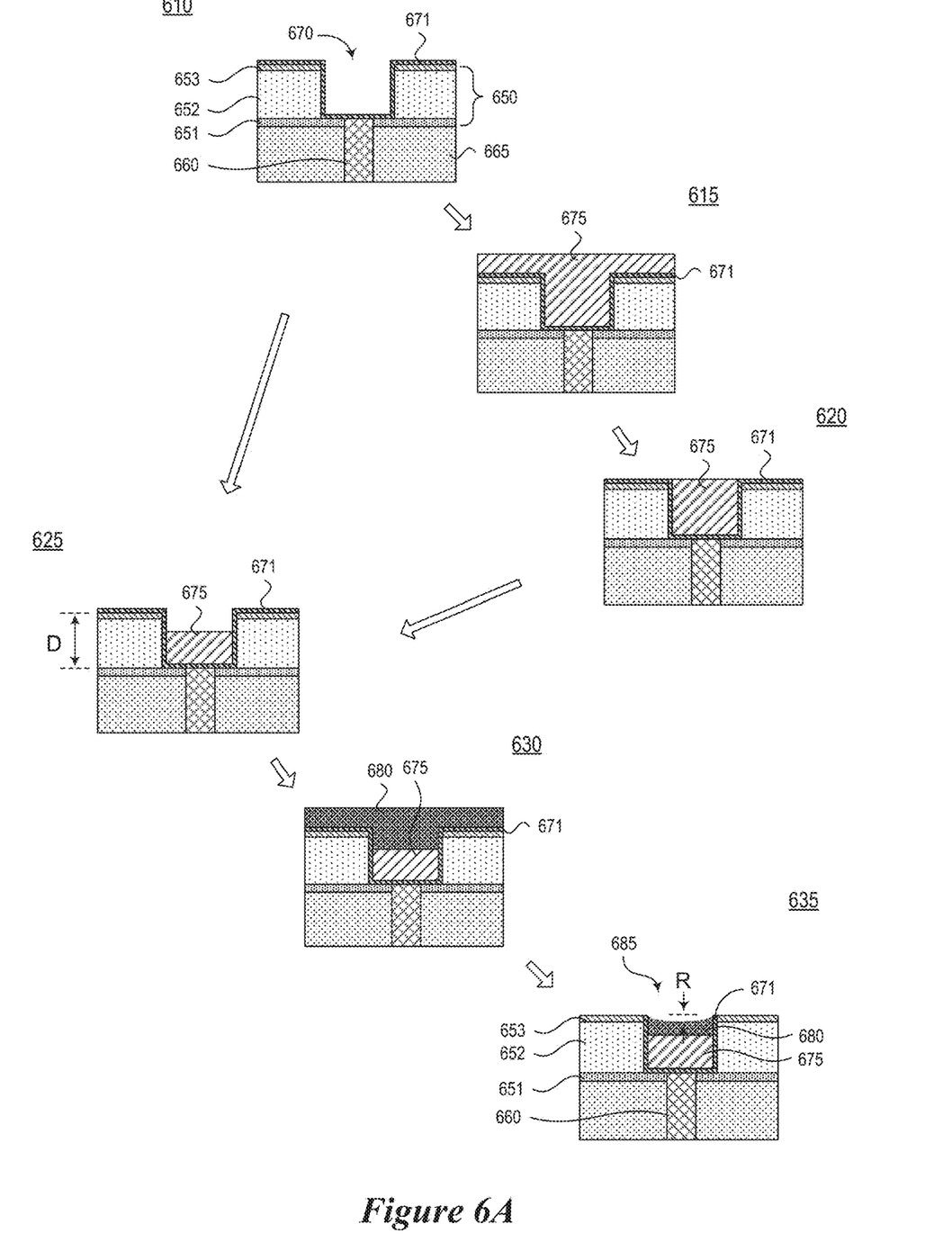
FIG. 6A illustrates process steps for forming bond pads in accordance with embodiments of the present technology.

FIG. 6A illustrates process steps for forming bond pads in accordance with embodiments of the present technology. FIG. 6A includes diagrams 610 through 635 illustrating details of several stages for forming individual bond pads (e.g., the bond pads 245, 285, and 385). It should be understood that although various structures depicted in FIG. 6A are related to illustrating process steps for forming bond pads on a backside of a semiconductor die (e.g., the bond pads 285 and 385), the process steps are applicable for forming bond pads on a frontside of a semiconductor die (e.g., the bond pads 245). For example, the bond pad 685 depicted in diagram 635 may correspond to the bond pads 285 and/or 385 of the semiconductor die 210 and 310, respectively, while the same process steps can be utilized to form the bond pad 245 of the semiconductor die 210.

Diagram 610 depicts an opening 670 formed in a dielectric material 650 and a conductive liner 671 (e.g., TaN liner 246 described with reference to FIG. 2A) formed on sidewall and bottom surfaces of the opening 670 and on the surface of the dielectric material 650. The opening 670 may have a footprint of a circle, an ellipse, or a rectangle, among others. The bottom surface of the opening 670 exposes a conductive structure 660, a portion of which is included in the dielectric material 650. In this manner, the conductive liner 671 is in contact with the conductive structure 660. Diagram 610 also illustrates a substrate 665, which may be an example of or include aspects of a substrate (e.g., a silicon substrate) of the semiconductor die 210 (or the interface die 310).

The dielectric material 650 may be a composite dielectric layer. In the embodiment illustrated in diagram 610, the dielectric material 650 includes three (3) layers of dielectric layers 651, 652, and 653, which may be examples of or include aspects of the dielectric layers 270, 275, and 280 described with reference to FIG. 2C (or the dielectric layers 370, 375, and 380 described with reference to FIG. 3), respectively. In other embodiments, e.g., when forming bond pads on a frontside of a semiconductor die (e.g., the bond pads 245), the dielectric material 650 may include the dielectric layers 235 and 240 described with reference to FIG. 2A. Further, in the embodiment illustrated in diagram 610, the conductive structure 660 may be an example of or include aspects of the TSV 225 (or the TSV 325). In other embodiments, e.g., when forming bond pads on a frontside of a semiconductor die (e.g., the bond pads 245), the conductive structure 660 may be an example of or include aspects of the TSV pad 226 as described with reference to FIG. 2A.

Diagram 615 depicts a first metal 675 formed in the opening 670 and over the conductive liner 671. In some embodiments, the first metal 675 includes copper, which may be plated on the conductive liner 671 using a plating liquid (e.g., using electroplating process steps). Diagram 620 depicts that the first metal 675 above the conductive liner 671 (e.g., excess portion of the first metal 675) has been removed. In some embodiments, CMP process steps are used to remove the excess portion of the first metal 675 and to stop on the conductive liner 671. Diagram 625 depicts that a portion of the first metal 675 in the opening 670 has been removed. In some embodiments, wet etch and/or plasma etch process steps that selectively remove the first metal 675 can be used to partially remove the first metal 675 in the opening 670.

In some embodiments, bottom-up deposition process steps that selectively form the first metal 675 in the opening 670 may be used to partially fill the opening 670 with the first metal 675, instead of using the process steps described with reference to diagrams 615 (e.g., copper plating steps), 620 (e.g., CMP process steps), and 625 (e.g., wet/plasma etch process steps). In this regard, the bottom-up deposition process steps may selectively form the first metal 675 (e.g., copper) on a first portion of the conductive liner 671 corresponding to the bottom surface of the opening 670 without forming the first metal 675 on a second portion of the conductive liner 671 corresponding to the sidewall surface of the opening 670 (or on the conductive liner 671 above the surface of the dielectric material 650).

Diagram 625 depicts the first metal 675 partially filling the opening 670, where the first metal 675 has a first top surface above and parallel with the bottom surface of the opening 670. In some embodiments, the first top surface corresponds to at least one-fourth of a depth of the opening 670 (denoted as "D" in diagram 625)—e.g., one-third, one-half, two-third, or the like, such that the remaining portion of the opening 670 can be filled with a second metal 680 as described with reference to diagrams 630 and 635. In this regard, the depth of the opening 670 approximately corresponds to a thickness of the bond pad (e.g., the bond pad 685) that forms in the opening 670.

Diagram 630 depicts a second metal 680 formed in the opening 670 (in contact with the first metal 675) and on the conductive liner 671. In some embodiments, the second metal 680 includes copper, which may be plated using a plating liquid (e.g., using electroplating process steps). In some embodiments, the copper corresponding to the second metal 680 may have different properties (e.g., different crystallographic orientation) than the copper corresponding to the first metal 675 as described below in more detail.

Diagram 635 depicts that the second metal 680 above the conductive liner 671 (e.g., excess portion of the second metal 680) has been removed. Further, the conductive liner 671 on the surface of the dielectric layer 653 is removed. In some embodiments, CMP process steps may be used to remove the excess portion of the second metal 680 and the conductive liner 671 before stopping on the dielectric layer 653. As depicted in diagram 635, the top surface of the second metal 680 may be generally flush with the surface of the dielectric material 650. For example, the second metal 680 does not protrude above the top surface of the dielectric material 650 (e.g., the dielectric layer 653). In the embodiment illustrated in diagram 635, the second metal 680 may be recessed with respect to the top surface of the dielectric material 650 (denoted as "R" in diagram 635) as a result of the CMP process. It should be understood that diagram 635 depicting the bond pad 685 is not drawn to scale—e.g., a range of a width of the bond pad 685 may vary from 0.2 to 10 micrometer (μm) whereas a range of the recess (R) may be less than 5 nanometer (nm).

In some embodiments, the copper filling the opening 670 includes multiple grains that each have different sizes and material properties from each other. Depending on the process conditions forming the copper (e.g., electroplating solutions, temperatures, liner layers on which the copper forms, annealing conditions after forming the copper), the copper grains may include a distribution of certain crystallographic orientations—e.g., (100), (110), (111), or the like. For example, the copper corresponding to the second metal 680 may include more than one-half of its copper grains having (111) crystallographic orientation—i.e., the copper having primarily or substantially (111) crystallographic orientation. Copper having (111) crystallographic orientation may be referred to as nanotwin copper (e.g., NT-copper (111)) that may facilitate bonding (conjoining) of copper during the direct bonding process including relatively lower post bond annealing temperatures (e.g., approximately 200° C. or lower). For example, nanotwin copper may facilitate grain growth across the bonding interface, intermixing of the copper atoms across the bonding interface, reducing microvoid formation at the bonding interface, etc. In some cases, the nanotwin copper may include a seed layer configured to facilitate formation of the nanotwin copper—e.g., a strongly (111) oriented seed layer with greater than 90% surface of the seed layer in (111) crystallographic orientation.

On the contrary to the copper corresponding to the second metal 680, the copper corresponding to the first metal 675 may have a primary crystallographic orientation different than (111) orientation, such as (100) or (110) orientations—e.g., more than one-half of its copper grains having a crystallographic orientation other than (111) orientation. In some cases, the copper corresponding to the first metal 675 may not have a particular primary (or main) crystallographic orientation—e.g., copper grains of the first metal 675 having various crystallographic orientations such that a primary or main crystallographic orientation cannot be determined. Although the foregoing examples of primary (or main) crystallographic orientations for copper are provided with more than one-half of copper grains having certain crystallographic orientations, the present technology is not limited thereto. For example, primary (or main) crystallographic orientations for copper may be determined based on more than 60%, 70%, 80%, or even greater portion of copper grains having a particular crystallographic orientation.

Figure 6B:
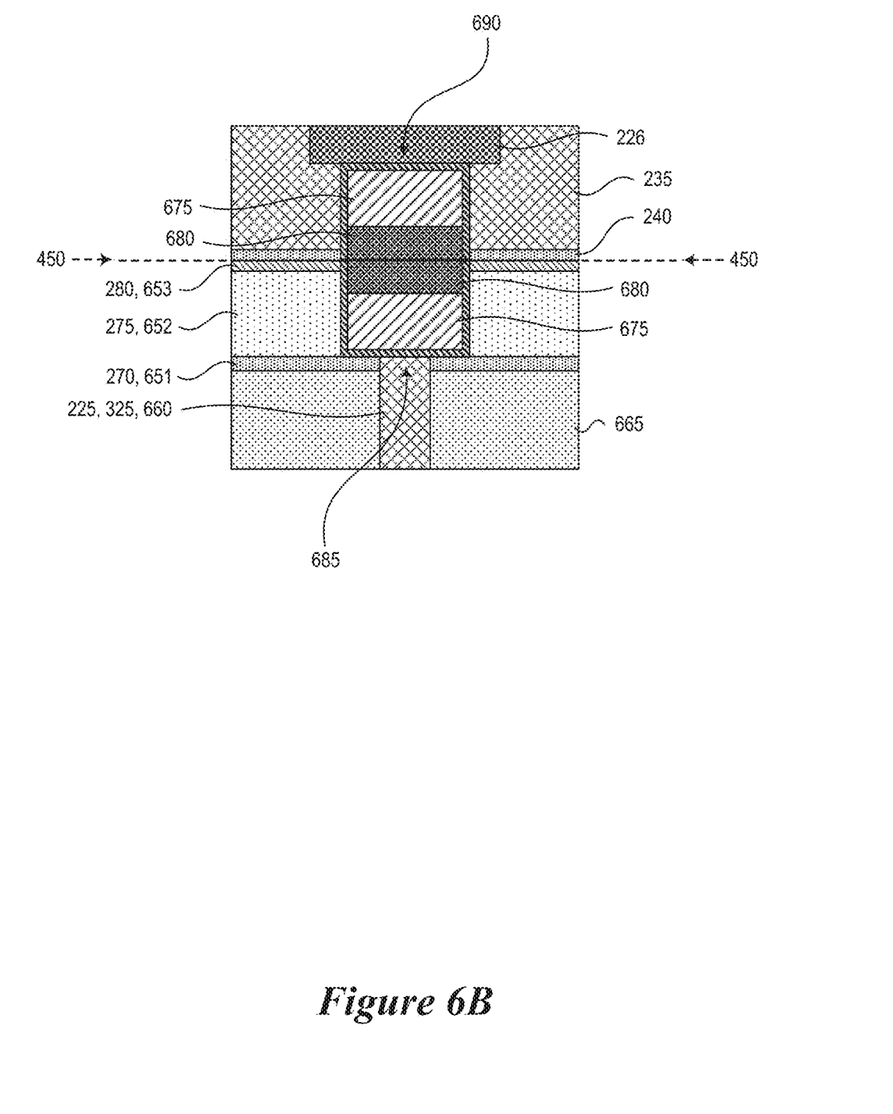
FIG. 6B is a diagram of bond pads bonded to each other in accordance with embodiments of the present technology.

FIG. 6B is a diagram of bond pads bonded to each other in accordance with embodiments of the present technology. FIG. 6B illustrates the bond pad 685 (of a bottom semiconductor die) in contact with (directly bonded to) another bond pad 690 (of a top semiconductor die), which may be an example of or include aspects of the bond pad 245 described with reference to FIG. 2A. The bond pad 690 may have been formed through the process steps described with reference to diagrams 610 through 635. For example, the bond pad 690 includes the first metal 675 and the second metal 680. Further, the bond pad 690 is coupled to the TSV pad 226 as described with reference to FIG. 2A.

Across the bonding interface 450, the second metal 680 from the bond pad 685 and the bond pad 690 forms a single block of second metal 680 (e.g., a contiguous piece of the second metal 680, copper with primarily (111) crystallographic orientation) providing an electrically conductive path between the conductive structure 660 (or the TSVs 225, 325) and the TSV pad 226, as well as providing a mechanical connection between the bond pads 685 and 690. Further, the dielectric layer 653 (or 280) directly bonded to the dielectric layer 240 provides additional bonding strength between the top and bottom dies.

Although FIG. 6B depicts both bond pads 685 and 690 including the first metal 675 and the second metal 680 (e.g., a composite metal structure), the present technology is not limited thereto. For example, in some embodiments, one of the bond pads 685 or 690 includes the first metal 675 only (while the other bond pad includes the composite metal structure). In such embodiments, the first metal 675 and the second metal 680 are bonded to each other at the bonding interface 450 to provide an electrically conductive path between the conductive structure 660 (or the TSVs 225, 325) and the TSV pad 226. In some embodiments, one of the bond pads 685 or 690 includes the second metal 680 only (while the other bond pad includes the composite metal structure). In some embodiments, both bond pads 685 and 690 includes the second metal 680 only (neither the bond pad 685 nor the bond pad 690 includes the composite metal structure).

FIG. 6B further illustrates that two dielectric layers are bonded to each other at the bonding interface 450—e.g., the dielectric layer 653 (or 280) bonded to the dielectric layer 240. As described herein, the dielectric layer 653 (or 280) may be deposited at a relatively lower process temperature (e.g., deposited during the process steps forming various structures on a backside of a semiconductor die) than the dielectric layer 240 (e.g., deposited during the process steps forming various structures on a frontside of a semiconductor die). In some embodiments, the adhesive material 260 (or 360) present when the dielectric layer 653 (or 280) is deposited limits the process temperatures for the dielectric layer 653 (or 280) as described with reference to FIG. 2C. In that regard, only difference between the dielectric layer 653 (or 280) and 240 may be the deposition temperature—e.g., around 180° C. versus around 350° C. In some embodiments, the dielectric layer 653 (or 280) and 240 may have the same material composition—e.g., SiCN. In some embodiments, the dielectric layer 653 (or 280) and 240 may have different material compositions—e.g., SiCN versus SiN.

Figure 7:
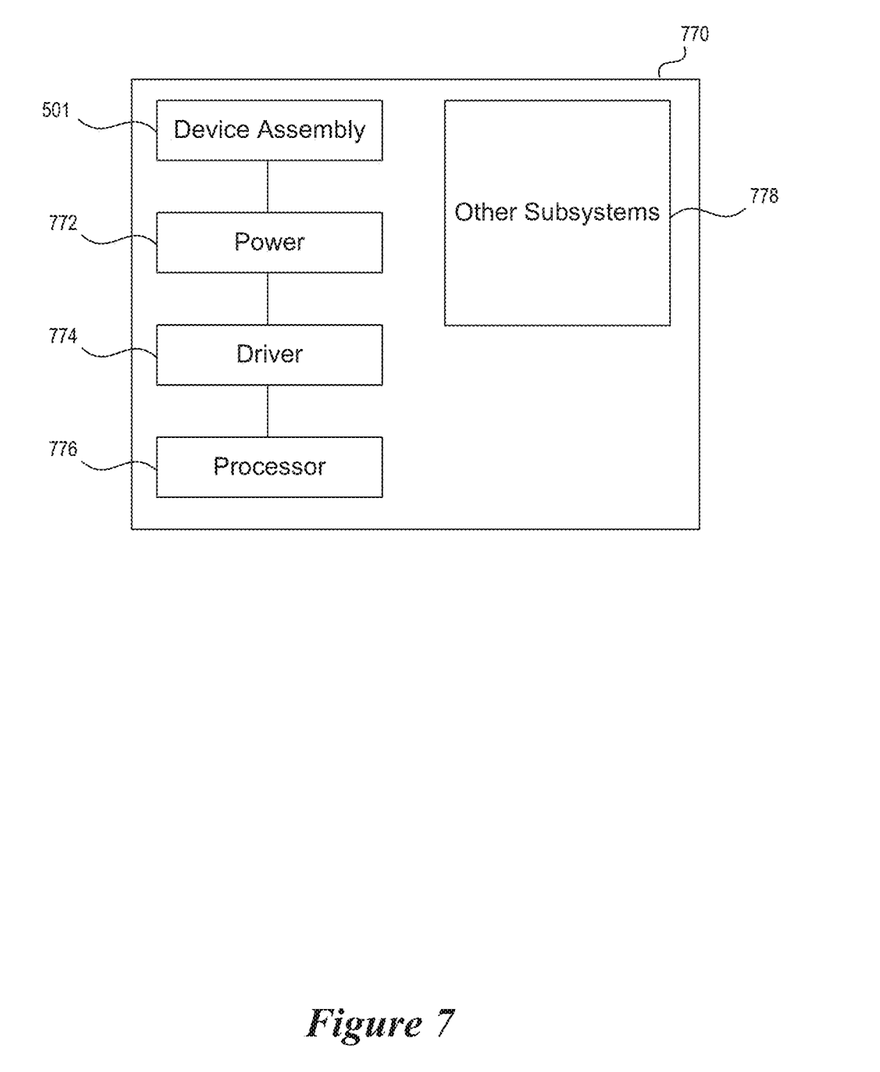
FIG. 7 is a block diagram schematically illustrating a system including a semiconductor die assembly configured in accordance with embodiments of the present technology.

The semiconductor die assemblies 501 described with reference to FIGS. 5, can be incorporated into any of a myriad of larger and/or more complex systems, a representative example of which is the system 770 shown schematically in FIG. 7. The system 770 can include the semiconductor die assembly 501, a power source 772, a driver 774, a processor 776, and/or other subsystems or components 778. The semiconductor die assembly 501 can include features generally similar to those with the bond pads described above—e.g., bond pads 685 and 690. In other words, the semiconductor die assembly 501 includes bond pads bonded to each other, where at least one of the bond pads include a first metal and a second metal different than the first metal. Moreover, the first metal is located at the bonding interface and the second metal has a first thickness corresponding to at least one-fourth of a second thickness of the first or second bond pad. The semiconductor die assembly 501 may include an increased memory (or storage) capacity at a given package height in view of an increased quantity of memory dies (e.g., DRAM dies) that can be accommodated in the package due to the zero-BLT configuration.

The resulting system 770 can perform any of a wide variety of functions, such as memory storage, data processing, and/or other suitable functions. Accordingly, representative systems 770 can include, without limitation, hand-held devices (e.g., mobile phones, tablets, digital readers, and digital audio players), computers, and appliances. Components of the system 770 may be housed in a single unit or distributed over multiple, interconnected units (e.g., through a communications network). The components of the system 770 can also include remote devices and any of a wide variety of computer readable media.

Figure 8:
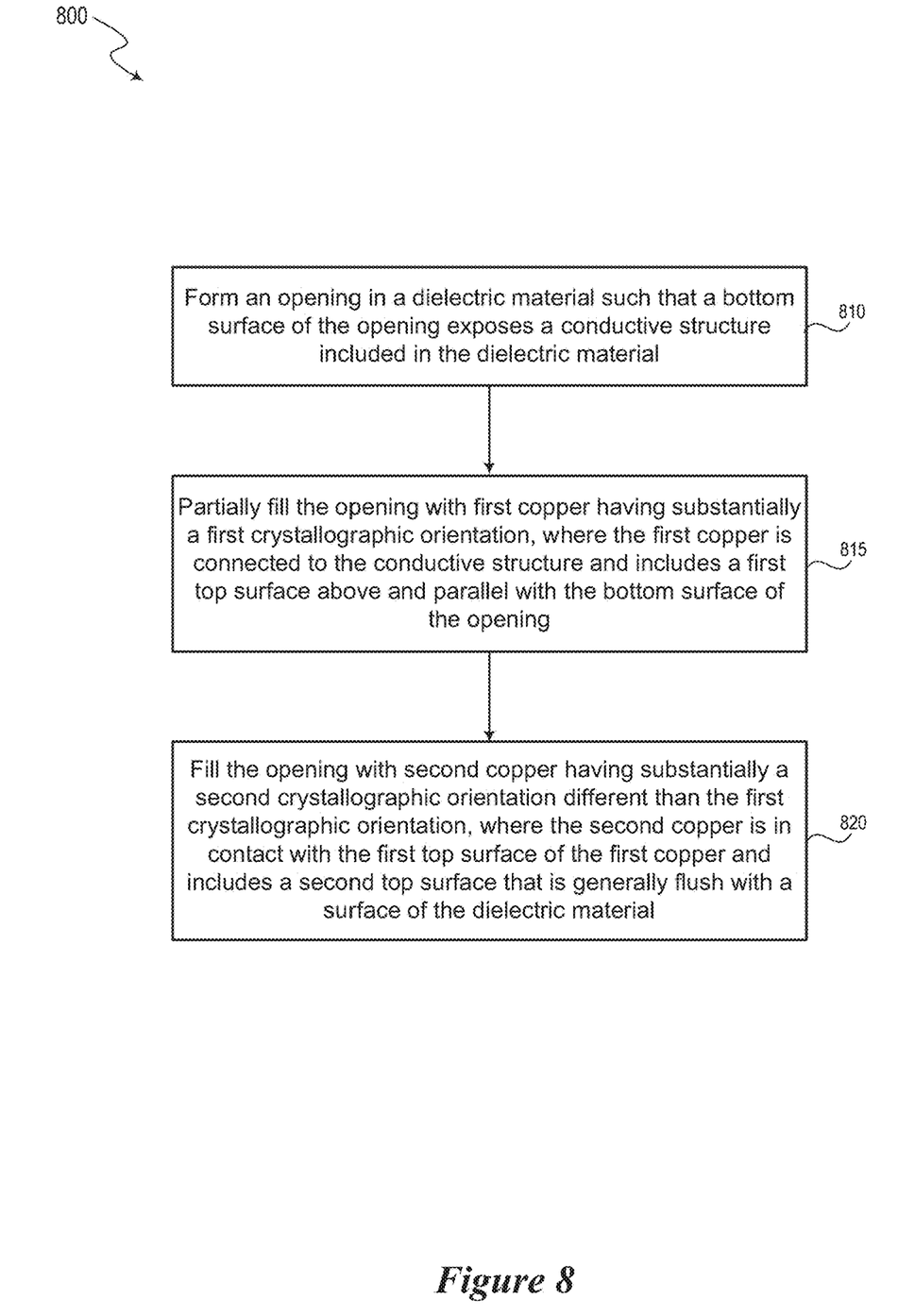
FIG. 8 is a flowchart of a method of forming bond pads in accordance with embodiments of the present technology.

FIG. 8 is a flowchart 800 of a method of forming bond pads in accordance with embodiments of the present technology. The flowchart 800 may include aspects of methods as described with reference to FIG. 6A.

The method includes forming an opening in a dielectric material such that a bottom surface of the opening exposes a conductive structure included in the dielectric material (box 810). The method further includes partially filling the opening with first copper having substantially a first crystallographic orientation, where the first copper is connected to the conductive structure and includes a first top surface above and parallel with the bottom surface of the opening (box 815). The method further includes filling the opening with second copper having substantially a second crystallographic orientation different than the first crystallographic orientation, where the second copper is in contact with the first top surface of the first copper and includes a second top surface that is generally flush with a surface of the dielectric material (box 820).

In some embodiments, the second crystallographic orientation corresponds to (111) orientation. In some embodiments, the method further includes forming, prior to partially filling the opening with the first copper, a conductive liner at the surface of the dielectric material, at a sidewall surface of the opening, and at the bottom surface of the opening, where the first copper is connected to the conductive structure through the conductive liner. In some embodiments, partially filling the opening with the first copper includes forming the first copper on a first portion of the conductive liner corresponding to the bottom surface of the opening without forming the first copper on a second portion of the conductive liner corresponding to the sidewall surface of the opening.

In some embodiments, partially filling the opening with the first copper includes forming the first copper on the conductive liner such that the first copper fills the opening, removing a first portion of the first copper above a plane corresponding to the surface of the dielectric material, and partially removing a second portion of the first copper from the opening. In some embodiments, filling the opening with the second copper includes forming the second copper over the first top surface of the first copper and over the surface of the dielectric material such that the second copper fills the opening, and removing a portion of the second copper above a plane corresponding to the surface of the dielectric material.

It should be noted that the methods described above describe possible implementations, and that the operations and the steps may be rearranged or otherwise modified and that other implementations are possible. Furthermore, embodiments from two or more of the methods may be combined. Further, it will be appreciated that specific embodiments of the technology have been described herein for purposes of illustration, but that various modifications may be made without deviating from the disclosure.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
   a first semiconductor die including a first bond pad on a first side of the first semiconductor die; and
   a second semiconductor die including a second bond pad on a second side of the second semiconductor die, wherein:
      the first bond pad is aligned and bonded to the second bond pad at a bonding interface therebetween; and
      at least one of the first and second bond pads include a first copper layer having primarily a first crystallographic orientation and a second copper layer having primarily a second crystallographic orientation different than the first crystallographic orientation, the first copper layer located at the bonding interface,
   wherein the first bond pad is connected to a through-substrate via (TSV) extending through the first semiconductor die and configured to couple the first bond pad to a conductive structure on a third side of the first semiconductor die, the third side opposite to the first side.

2. The semiconductor die assembly of claim 1, wherein the first crystallographic orientation corresponds to (111) orientation.

3. The semiconductor die assembly of claim 1, wherein the second copper layer has a first thickness corresponding to at least one-fourth of a second thickness of the first or second bond pad.

4. The semiconductor die assembly of claim 1, wherein:
   the first side of the first semiconductor die includes a first dielectric material around the first bond pad, the first dielectric material formed at a first temperature;
   the second side of the second semiconductor die includes a second dielectric material around the second bond pad, the second dielectric material formed at a second temperature greater than the first temperature; and
   the first and second dielectric materials are bonded at the bonding interface.

5. The semiconductor die assembly of claim 4, wherein the first and second dielectric materials correspond to silicon carbon nitride.

6. The semiconductor die assembly of claim 1, wherein the first and/or second semiconductor dies exchange electrical signals with a device external to the semiconductor assembly through the conductive structure.

7. The semiconductor die assembly of claim 1, wherein the second bond pad is connected to a second through-substrate via (TSV) extending through the second semiconductor die and configured to couple the second bond pad to a third bond pad on a fourth side of the second semiconductor die, the fourth side opposite to the second side.

8. The semiconductor die assembly of claim 7, wherein:
   the fourth side of the second semiconductor die includes a first dielectric material around the third bond pad, the first dielectric material formed at a first temperature; and
   the second side of the second semiconductor die includes a second dielectric material around the second bond pad, the second dielectric material formed at a second temperature greater than the first temperature.

9. The semiconductor die assembly of claim 7, wherein:
   the third bond pad is configured to bond with a fourth bond pad of a third semiconductor die of the semiconductor assembly at a second bonding interface; and at least one of the third and fourth bond pads include a third copper layer having primarily the first crystallographic orientation and a fourth copper layer having primarily the second crystallographic orientation, the third copper layer located at the second bonding interface.

10. The semiconductor die assembly of claim 1, wherein:
the first semiconductor die corresponds to a logic die or an interposer die; and
the second semiconductor die corresponds to a memory die.

11. A semiconductor die assembly, comprising:
a logic die including a first side and a second side opposite to the first side, wherein:
   the first side includes integrated circuitry and conductive structures coupled thereto; and
   the second side includes first bond pads operatively coupled with the conductive structures through through-substrate vias (TSVs) extending through the logic die; and
a memory die bonded at the second side of the logic die, the memory die including a frontside having a memory array and second bond pads operatively coupled with the memory array, wherein:
   individual second bond pads are aligned and bonded to corresponding first bond pads at a bonding interface between the memory die and the logic die; and
   the first, second, or both first and second bond pads include a first copper layer having primarily a first crystallographic orientation and a second copper layer having primarily a second crystallographic orientation different than the first crystallographic orientation, the first copper layer located at the bonding interface.

12. The semiconductor die assembly of claim 11, wherein:
the memory die comprises third bond pads disposed on a backside of the memory die opposite to the frontside, the third bond pads coupled to the second bond pads through through-substrate vias (TSVs) extending through the memory die;
the third bond pads are surrounded with a first dielectric material formed at a first temperature; and
the second bond pads are surrounded with a second dielectric material formed at a second temperature greater than the first temperature.

13. The semiconductor die assembly of claim 12, wherein the memory die is a first memory die, the semiconductor assembly further comprises:
a second memory die including fourth bond pads at a frontside of the second memory die having a second memory array operatively coupled with the fourth bond pads, wherein:
   individual third bond pads are aligned and bonded to corresponding fourth bond pads at a second bonding interface between the first and second memory dies; and
   the third, fourth, or both third and fourth bond pads include a third copper layer having primarily the first crystallographic orientation and a fourth copper layer having primarily the second crystallographic orientation, the third copper layer located at the second bonding interface.

* * * * *